United States Patent [19]
Vali et al.

[11] Patent Number: 5,233,673
[45] Date of Patent: Aug. 3, 1993

[54] OUTPUT STEERABLE OPTICAL PHASED ARRAY

[75] Inventors: Victor Vali, Laguna Hills; David B. Chang, Tustin; Albert F. Lawrence, San Diego, all of Calif.

[73] Assignee: Hughes Aircraft Company, Los Angeles, Calif.

[21] Appl. No.: 773,471

[22] Filed: Oct. 9, 1991

[51] Int. Cl.$^5$ .............................................. G02B 6/10
[52] U.S. Cl. ........................................ 385/3; 385/14; 385/27
[58] Field of Search ................ 385/4, 1, 2, 3, 8, 27, 385/14; 341/111, 137

[56] References Cited

U.S. PATENT DOCUMENTS

| | | | |
|---|---|---|---|
| 4,502,037 | 2/1985 | Le Parquier et al. | 385/3 X |
| 4,718,069 | 1/1988 | Streifer et al. | 372/50 |
| 4,940,303 | 7/1990 | Abeles et al. | 385/4 |
| 5,010,346 | 4/1991 | Hamilton et al. | 385/27 X |
| 5,023,882 | 6/1991 | Paoli | 372/50 |

FOREIGN PATENT DOCUMENTS

| | | |
|---|---|---|
| 8904988 | 6/1989 | United Kingdom . |
| 2217867 | 11/1989 | United Kingdom . |

OTHER PUBLICATIONS

K. Takizawa, "Electrooptic Fresnel Lens-Scanner with An Array of Channel Waveguides"; Applied Optics, vol. 22, No. 16, Aug. 1983.

An information sheet issued by the Defence Technology Enterprises, Ltd., Royal Signals and Radar Establishment, Worcestershire, UK. (3 pp.) (1988).

*Primary Examiner*—John D. Lee
*Assistant Examiner*—Phan T. Heartney
*Attorney, Agent, or Firm*—Elizabeth E. Leitereg; Terje Gudmestad; W. K. Denson-Low

[57] ABSTRACT

Optical phased arrays employing a large number of light emitters and optical phase delays between adjacent emitters to steer and focus an optical beam from the contributions of all the light emitters. The array can include a laser oscillator (22) as the light source, with the laser light being conducted via optical waveguides (26, 30 and 32) into optical fibers (34), with phase delays being effected by piezoelectric or electro-optic effects on the optical waveguides. The array can be used in a low cost display device for generating optical images or in an optical memory.

20 Claims, 6 Drawing Sheets

OUTPUT STEERABLE OPTICAL PHASED ARRAY

BACKGROUND OF THE INVENTION

The present invention is directed to a phased array operable at optical wavelengths.

Phased array antennas operating at microwave frequencies have long been used in applications such as radar, and provide the capability for electronically steering a beam from the array. However, the difficulties of implementing microwave phased arrays increase as the wavelength decreases, since the size of the components must decrease correspondingly. Phased arrays operable at optical wavelengths arrays could be used in display devices in place of cathode ray tube devices, and in applications such as optical memory readouts.

An information sheet apparently issued by the Defence Technology Enterprises, Ltd., Royal Signals and Radar Establishment, Worcestershire, UK, describes an integrated electro-optic device for steering light from a laser. The rear of the device is illuminated with light focussed to a spot. Divergence of light occurs to fill the array. Limitations of the device disclosed in this information sheet include the relative low efficiency, since much of the input light does not appear to find its way into an optical waveguide, lack of capability of providing a two dimensional array and apparent significant sidelobe energy.

Accordingly, it would represent an advantage in the art to provide an optical phased array which provides the capability of efficiently steering an output light beam in a desired direction.

SUMMARY OF THE INVENTION

An optical phased array is described, and includes an array of monochromatic light emitters arranged along a linear axis. The emitters are spaced apart from each other by distances in the range of one to ten micrometers. The array comprises, in one embodiment, an input light source and an optical waveguide pattern formed on an electro-optic substrate. The waveguide pattern is arranged to divide the light from the light source entering one input end of a waveguide into a plurality of waveguide channels which each allow the light to be emitted from a channel end. The optical phased array further includes means for adjusting the relative optical phase delay between adjacent light emitters to provide a progressive phase delay change across the array to steer the array beam or spot resulting from the light emitters to a desired direction.

In a general sense, the relative optical phase delay is determined both by the position of the focal point and the position of the emitter in the array. Relative phase delays must be set so that the number of wave cycles between a given source and the focal point differs by an integral number of cycles from the number of wave cycles between a second source and the focal point. Errors of up to ¼ of a cycle can be tolerated if the number of elements is sufficiently large.

In one embodiment, the optical waveguide comprises a light conducting material characterized by a relatively large electro-optic coefficient. For each channel, the phase is adjusted by means of a pair of metal electrodes straddling the optical waveguide comprising the channel and by a means for developing a selectable potential difference across the electrode pair. The optical phase delay may be varied by adjusting the potential difference, thereby changing the index of refraction of the light conducting material.

The optical phased arrays may be employed in such applications as optical memories and image display systems.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

Figure 1:
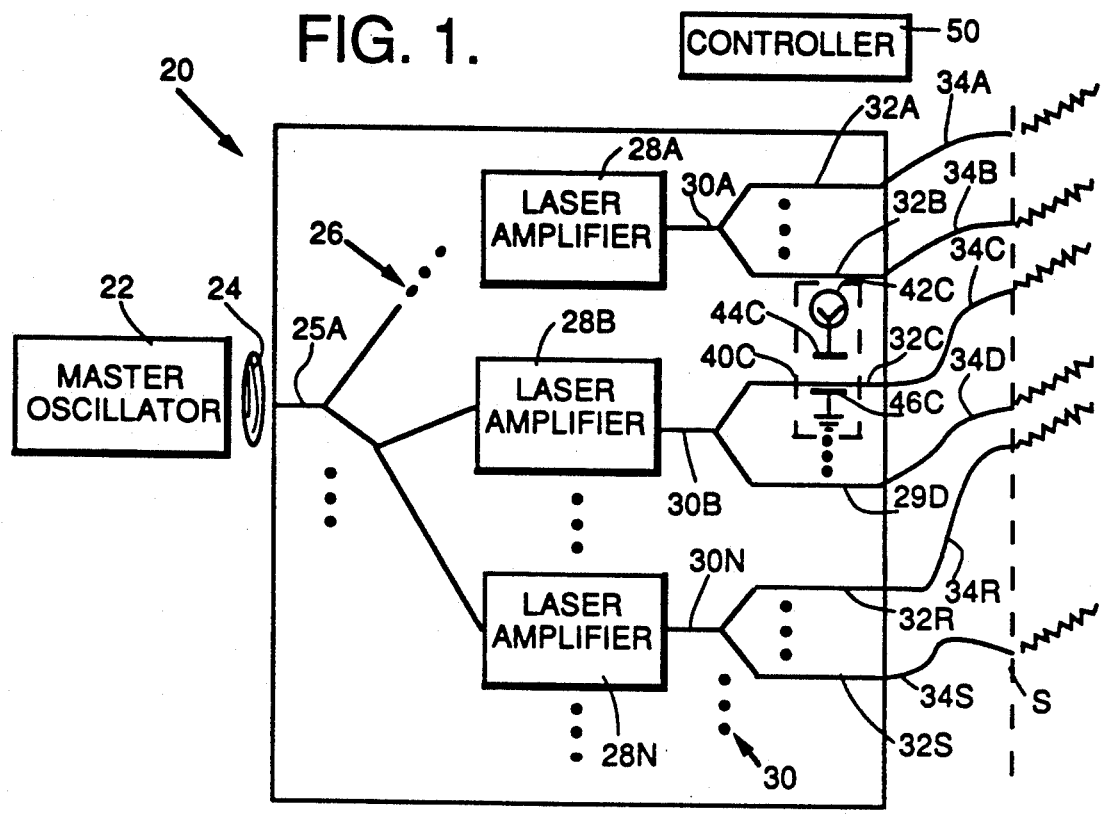
FIG. 1 is a schematic block diagram of a first embodiment of an optical phased array in accordance with the invention.

The invention makes use of techniques developed for microwave phased arrays to deflect and to focus visible radiation. Since the wavelength of light is a factor of $10^4$ to $10^5$ times smaller than microwave wavelengths, the array components have to be of the order of 1 to 10 $\mu$m. Optical fibers and/or waveguides and semiconductor lasers are used to generate and adjust the relative phases along a number of optical paths so that the light emitted is effectively focused to 1 milliradian divergence and deflected more than 0.1 radian.

To illustrate the invention, consider that monochromatic light is emitted by light emitters located along a linear array at points A, B, C, D, .... Light is focussed at focal point FP when the following condition is satisfied for all pairs (x,y) of sources:

$$\phi_x + (2\pi d_{x,FP})/\lambda = \phi_y + (2\pi d_{y,FP})/\lambda + 2\pi K$$

where $\phi_x$ is the phase adjustment at source x, $d_{x,FP}$ is the distance from source x to the focal point, d is the wavelength of light, $\phi_y$ is the phase adjustment at source y, $d_{y,FP}$ is the distance from source y to the focal point, and k is an integer.

In the case of a two dimensional array, the equation can be generalized to specify conditions for focus in three dimensions.

When the optical phase delay $\phi_x$ is varied properly the resultant focal point can be scanned. A beam in an optical N×N array can be focused to a diffraction limited angular width ΔD $$\Delta D/D \approx 1/N \text{ for } D<<1$$

where D represents the divergence angle.

To obtain the angular resolution ΔD of a human eye ($\approx 1$ milliradian) N should be of the order of 1000 for a linear array and 4000 for a two dimensional array.

A bundle of 10 μm diameter optical fibers containing $10^6$ fibers forms a square, 1 cm on the side. Such bundles are presently commercially available, made of high numerical aperture fibers such that the crosstalk between adjacent fibers is very small (<40 dB). Such bundles can be employed in a optical phased array in accordance with the invention.

The optical phased array can be made using semiconductor lasers (for example, edge emitting) without fibers. However, the relative phase control has to be accomplished for each laser individually using refraction variation or physical length change. For a small bundle of fibers projecting at a large distance these relative phase shifts can be calculated as linear functions, dependent on the position of the position of the beam spot, the position of the individual fiber and distance to the screen. For larger arrays, the required corrections become second or third order. This depends upon the magnitude of the ratio of the distance across the array to the z-component of the distance between the array and the focal point. Second order functions are generally sufficient for image display purposes, while third order corrections need to be included for memory readouts. Generally, including higher order corrections also improves the efficiency of the array. (Second order correction functions have been known for many years to mathematicians as theta functions.)

The divergence of the light beam from a fiber end is determined by the numerical aperture and by the fiber core diameter. For single mode fibers the divergence can be on the order of 0.4 radian or 20 degrees. This deflection can be amplified by means of lenses.

FIG. 1 shows one possible arrangement of components for a single array element of an optical phased array 20 in accordance with the invention. Light from the master laser oscillator 22 is focussed by a lens 24 onto an edge of an integrated electro-optical chip circuit 25, which comprises an input optical waveguide 25A, which transitions to a first beamsplitting network 26 of optical waveguides and beamsplitters, a series of integrated laser amplifiers 28A-N, a second beamsplitting network 30 leading to a plurality of output optical waveguides 32A-N which exit the output edge of the chip 25. The chip 25 further comprises a plurality of electro-optical phase changing networks 40A-N described below. The focussed light from the oscillator 22 enters the input optical waveguide 25A, and is guided into the first beamsplitting network 26, which conducts the light to the laser amplifiers 28 A-N. To ensure the reference phase in semiconductor laser light sources, one laser is used as the master oscillator 22, and the series of laser amplifiers are fed by light divided by the first beamsplitting network 26.

The amplified light from the series of laser amplifiers 28A-N is then fed to the second beamsplitting network 30. The network 30 includes a plurality of input optical waveguides 30A-N, one each coupled to receive the amplified light from a corresponding laser amplifier, and a plurality of output optical waveguides 32A-S. The first ends of a corresponding plurality of optical fibers 34A-S are spliced by a conventional technique to the edge of the chip 25 in communication with the ends of the respective output waveguides 32A-S, thereby conducting the light from the respective output waveguides into the corresponding optical fiber. The light is emitted from the second ends of the optical fibers to create the array beam which may be steered and focussed in accordance with the invention. In order to get complete interference, i.e., in order for the light to cancel at all points outside the focus, the polarization vectors of the light from the sources must be the same, and must be preserved along the optical pathway. Polarization preserving fibers and polarization preserving optical waveguides are readily available.

Figure 2:
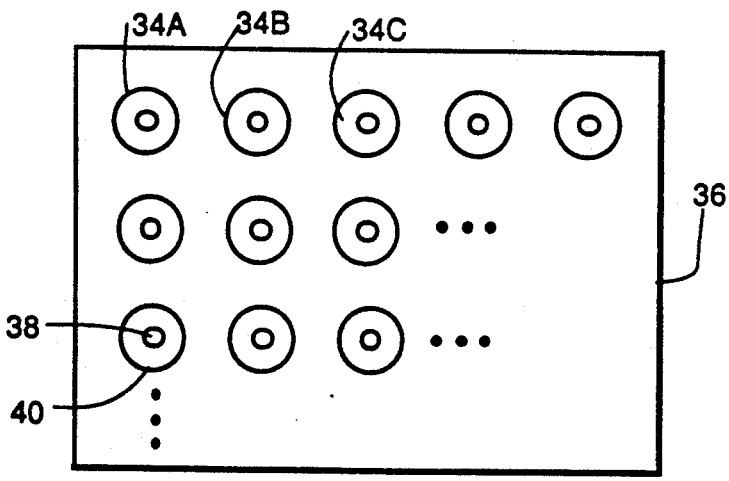
FIG. 2 illustrates an exemplary bundle of optical fibers arranged in a two-dimensional array which may be employed in the optical phased array of FIG. 1. The cores of the fibers can be placed eccentrically, giving a randomized arrangement as in FIG. 5.

The optical fibers 34A-N can be disposed along an axis, or preferably combined in a bundle, as illustrated in FIG. 2. The bundle 36 is cut and the cut fiber ends are polished to provide a plane face at plane S (FIG. 1). The second polished ends of the fibers 34A-S constitute the effective sources for light from the optical phased array. As is well known, an optical fiber consists of a core 38 which is clad by a cladding material 40 (FIG. 2). The core 38 is typically about 2-5 micrometers in diameter, and the cladding 40 is typically about 20-100 micrometers in thickness depending on the drawing process. The array spacing within bundle 36 is determined by the cladding thickness and the placement of the core within the cladding. The advantage of such a bundled fiber output array is that it provides a means of converting an essentially one-dimensional output from the output edge of the chip 25 into a two-dimensional array of light emitters at plane S. The cores of the fibers can be placed eccentrically within the fiber cladding giving a randomized arrangement as in FIG. 5.

All the array elements 34A-S are controlled by the same oscillator 22 so that zero phase is well defined and is the same for all elements 34A-S.

The phase of the light beam for a particular fiber element is controlled electrically by electronic phase change networks 40A-40N associated with respective output waveguide elements 29A-29N comprising chip 25. Each phase change network comprises a voltage source and a pair of electrodes disposed along a length of the respective optical waveguide. Thus, exemplary network 40C comprises a voltage source 42C and electrodes 44C and 46C. The voltage source of each element is controlled by a beam steering and focussing controller 50 to provide the appropriate phase on the light beam from each of the elements to achieve the desired array beam. Depending on the particular waveguide material, the phase can be controlled piezoelectrically, by changing the length of the fiber between the electrodes, or electroptically by changing the index of refraction of the optical fiber waveguide between the electrodes. For example, optical waveguides made of lithium niobate can produce the piezoelectric effect in response to voltages across the electrodes, and optical waveguides made of lithium niobate are characterized by changing the index of refraction in response to voltage changes. In the latter example, electrodes with a length of several millimeters could produce the desired effect with a voltage of 5 volts.

The piezoelectric response time is determined by the Young modulus of the waveguide, typically on the order of a microsecond. This is too large for some applications. Electro-optic response times, on the other hand, can be a nanosecond or less.

Figure 3:
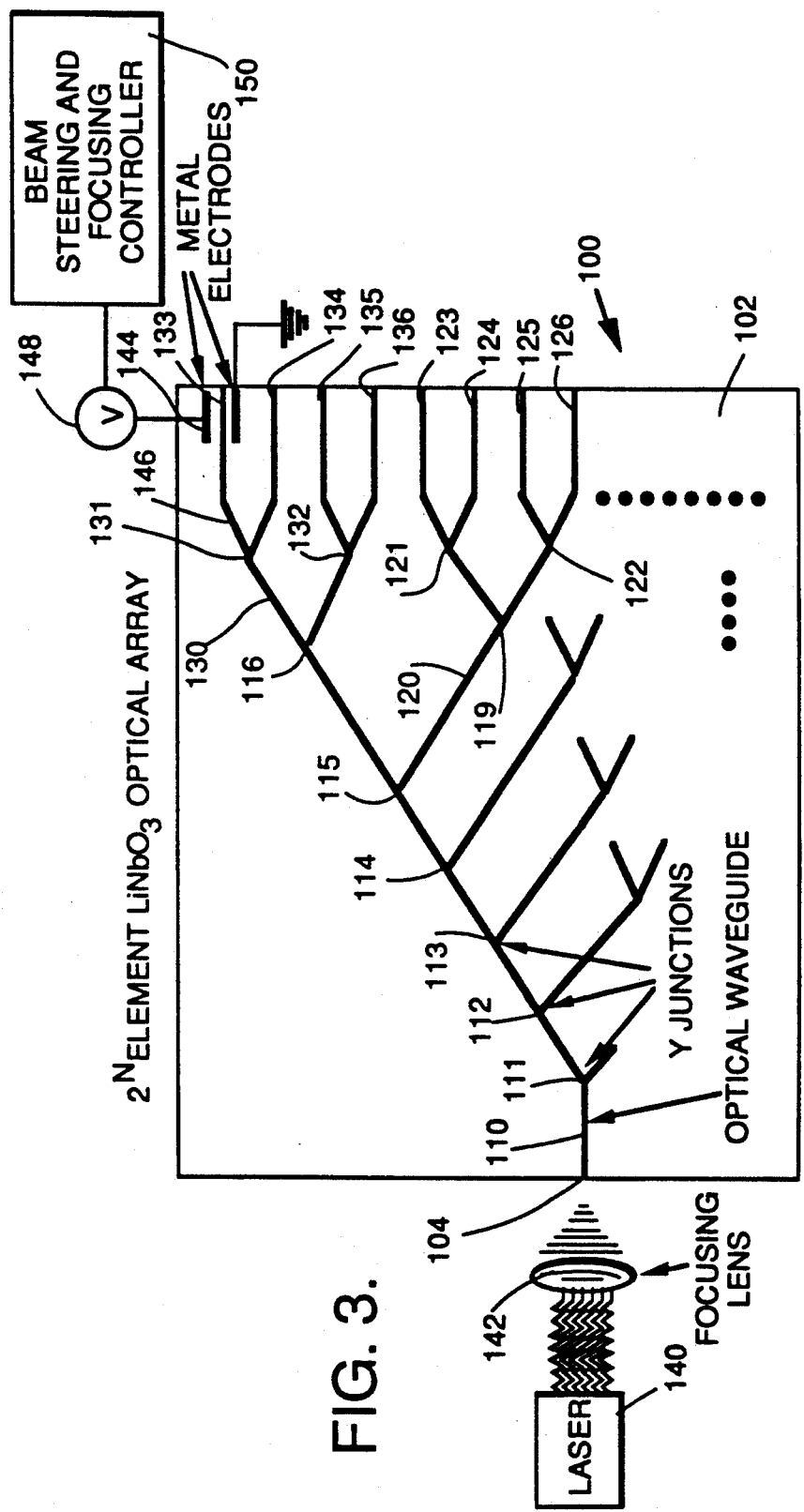
FIG. 3 is a schematic block diagram of a second embodiment of an optical phased array embodying the invention.

FIG. 3 shows an embodiment of an optical phased array 100 in accordance with the invention employing a $2^N$ element array formed on a Lithium Niobate (LiNbO$_3$) substrate 102. This material is characterized by a large electro-optic coefficient, i.e., a relatively large change in the index of refraction of the substrate per unit applied voltage change. A suitable alternate material for the substrate is LiTaO$_3$, for example. The substrate has formed therein an integrated optical waveguide 110 which defines in this embodiment six Y junctions 111-116, i.e., N=six, with each arm of each Y in turn defining two additional Y junctions. Each arm of each junction in turn terminates at the edge of the substrate. For example, arm 120 of Y junction 115 leads to another Y junction 119, whose respective arms lead to Y junctions 121 and 122. The arms 123 and 124 of junction 121 terminate at the edge of the substrate 102. The arms of the junction 116 lead to junctions 131 and 132, which have respective arms 133, 134, 135, and 136, all terminating at the edge of the substrate 102. The use of Y junctions as the beamsplitting means is very efficient since very little light is lost at the Y junctions.

As is well known in the art, titanium or hydrogen can be diffused into the lithium niobate substrate to form the optical waveguide channels. Optical waveguides formed on a substrate are known in the art, see, e.g., "A Low-Voltage 8×8 Ti:LiNbO$_3$ Switch with a Dilated-Benes Architecture," J. E. Watson et al., Journal of Lightwave Technology, 8:794, 1990.

One advantage of the embodiment shown in FIG. 3 is that it is possible to make the phase changer and amplifier very short in the direction of light propagation. The laser oscillator light can alternatively be directed perpendicularly to the surface of the substrate, which contains the required optical elements as a closely-spaced array.

It will be appreciated that the optical path lengths from the input 104 of the optical waveguide 110 to each waveguide output is carefully controlled to be identical, or of some length differential between adjacent waveguide channels to produce a desired nominal beam direction. Light polarization is preserved in this arrangement, because the optical waveguides are short enough that birefringence effects are unimportant.

A laser 140 is used as the light source for the optical phased array 100. The light energy from the laser 140 is focussed by a lens 142 onto the input end 104 of the optical waveguide 110 defined in the chip substrate 102.

Differential phase delays between the respective light emitters defined by the output ends of the optical waveguides are provided in order to steer and focus the array output beam.

Means are included to selectively apply a modulating voltage transversely across the output optical waveguides, including waveguides 123-126 and 133-136. Such means includes, for each output waveguide, a pair of metal electrodes sandwiching the output waveguide and a voltage source for applying a voltage between the respective electrodes. By applying progressively different voltages to successive output waveguides, the optical path length of each output waveguide can be varied by affecting the index of refraction. This permits the output beam to be steered and focused.

The length of the electrodes is determined by the electro-optical coefficient of the waveguide medium, in this case lithium niobate. For this example, the electrodes can be several millimeters long, and achieve a $2\pi$ phase change with variations in applied voltage of 5 volts or so.

Thus, for the exemplary output waveguide 133, electrodes 144 and 146 are disposed adjacent a short length of the waveguide. Electrode 146 is grounded, and the electrode 144 is connected to a voltage source 148, in turn controlled by a beam steering and focusing controller 150. Each output waveguide has associated with it a respective pair of electrodes and a voltage source, controlled by the controller 150. The controller 150 adjusts the voltage applied to the respective electrodes so as to apply progressively different voltages to the electrodes, thereby progressively adjusting the optical path lengths through the various waveguides to steer and focus the output beam of the array 100.

Figure 4:
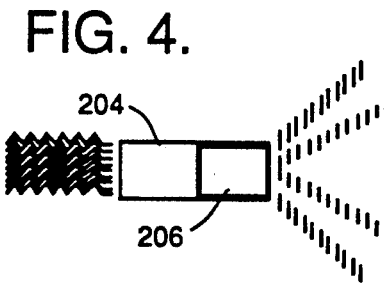
FIG. 4 is a schematic block diagram of an array element of a third embodiment of an optical phased array in accordance with the invention.

Long waveguides in fiber optic or integrated optics phased arrays are not necessary to practice the invention. In the embodiment shown in FIG. 4, the optical phased array comprises a number of semiconductor laser phased array elements fed by laser light from a common master oscillator via a beamsplitting network (not shown in FIG. 4). Each array element comprises an optical phase changer and a semiconductor laser amplifier. For example, as shown in FIG. 4, an exemplary array element comprises phase changer 204 and semiconductor laser amplifier 206. The laser light from the master oscillator is passed through the phase changer 204 to achieve the desired phasing in relation to the other elements comprising the array 200. If the amplifier 206 is built with an emitting area of 0.25 square micrometers, the amplified beam will have a divergence of more than one radian. In this case, it is possible to deflect the beam by more than $\pm 45$ degrees.

The phase changer 204 of FIG. 4 can comprise a short length of optical waveguide made of lithium niobate for example, with a pair of electrodes mounted adjacent the waveguide walls as in the embodiment of FIG. 3. Similarly, a voltage source (not shown in FIG. 4) applies a voltage to the electrodes to produce a desired electro-optic effect to vary the optical length, as described above with respect to FIG. 3.

Figure 5:
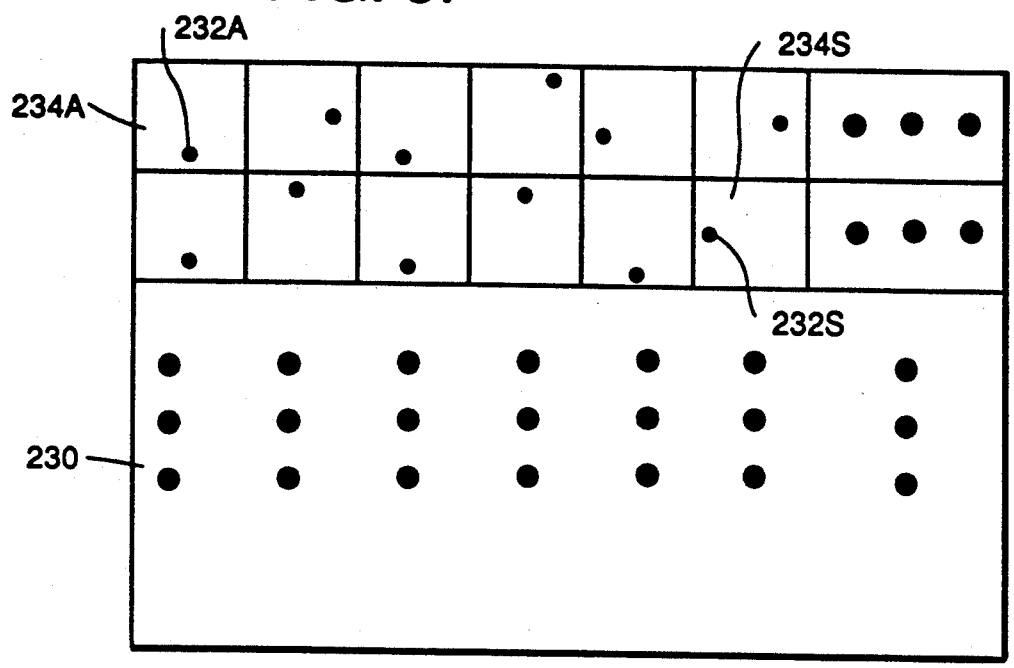
FIG. 5 illustrates the randomized placement within regular cells of the light emitters comprising an optical phased array to reduce sidelobes.

For all optical phased arrays with lattice separation less than 0.71 $\lambda$, where $\lambda$ is the wavelength of operation, sidelobes are a problem. There are at least two ways to handle this problem. The first is to use lenses to divert the sidelobes by more than the angular projection of the screen, i.e., the area on which an image is being projected. The second is to choose positions in the array which give efficient cancellation. For example, when displacement of the elements within the array are correctly chosen, most of the energy is concentrated in the central spot and field levels at other positions resemble a random distribution, with a standard deviation proportional to $1/(n)^{\frac{1}{2}}$ where n is the number of array elements. This means the intensity of the background field surrounding the focussed spot is inverse to the number of elements in the array. One possible placement technique is to randomize the emitter positions in the array. For example, FIG. 5 illustrates a randomized placement of each emitter within its corresponding regular cell within a two-dimensional array 230. This may be accomplished by feeding the phase shifted light into a bundle of optical fibers in which each core is placed eccentrically within the cladding. The basic arrangement for the optics corresponds to FIG. 1. Each emitter 232A-S is assigned a random location within its corresponding cell 234A-S. The cells form a regular subdivision of the array, for example, a square 100 microns on a side.

Figure 6:
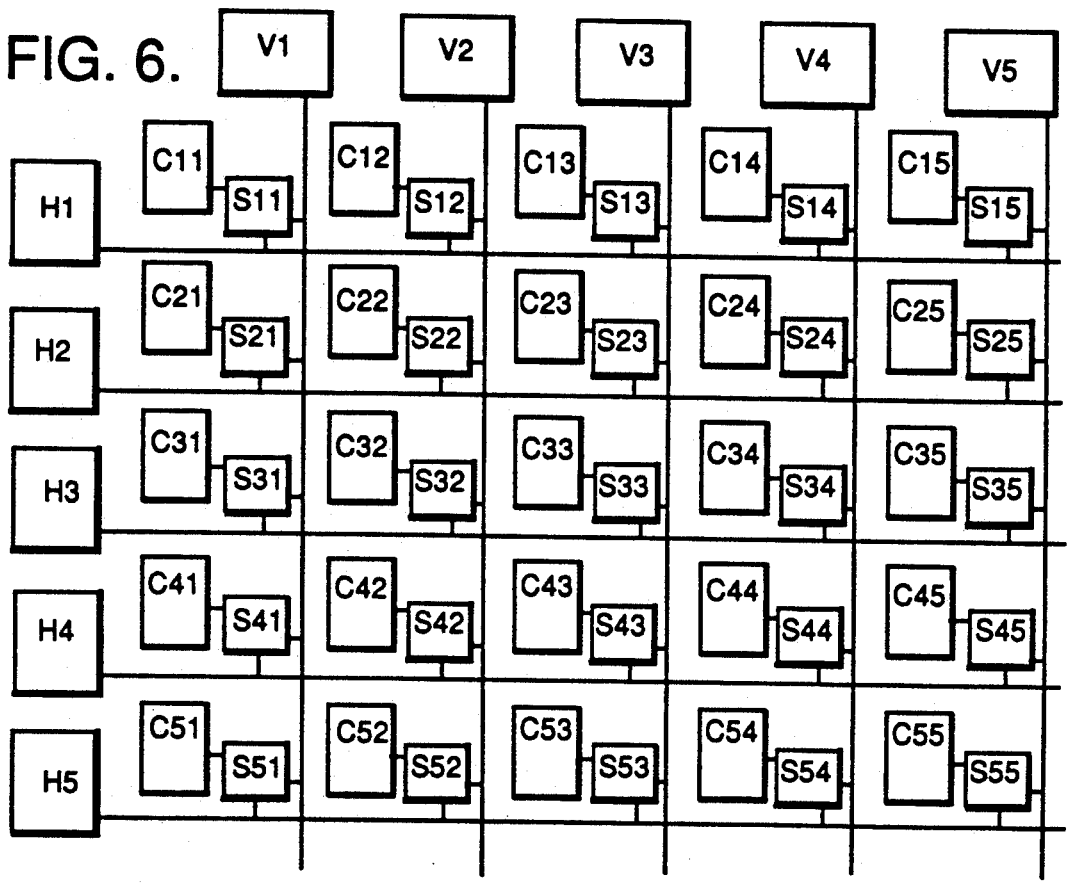
FIGS. 6 and 7 illustrate a general scheme for phase shifting in optical arrays in accordance with the invention.

FIG. 6 represents a general two-dimensional scheme for combining phase shifts at each array location. $S_{ij}$ represents the phase shifting electrodes for the array location (i, j); $H_i$ represents the output from the electronics for calculating the phase shifts due to horizontal displacements $V_j$ represents the output from the electronics for vertical displacements; and $C_{ij}$ represents the output from the electronics for calculating cross effects between the displacements. Note that $H_i$ is constant for any horizontal line of elements in the array and $V_j$ is constant for any vertical line of elements in the array. The phase shift for location (i, j) is $S_{ij} = H_i + V_j + C_{ij}$, and is added by the electronics at location i, j).

Figure 7:
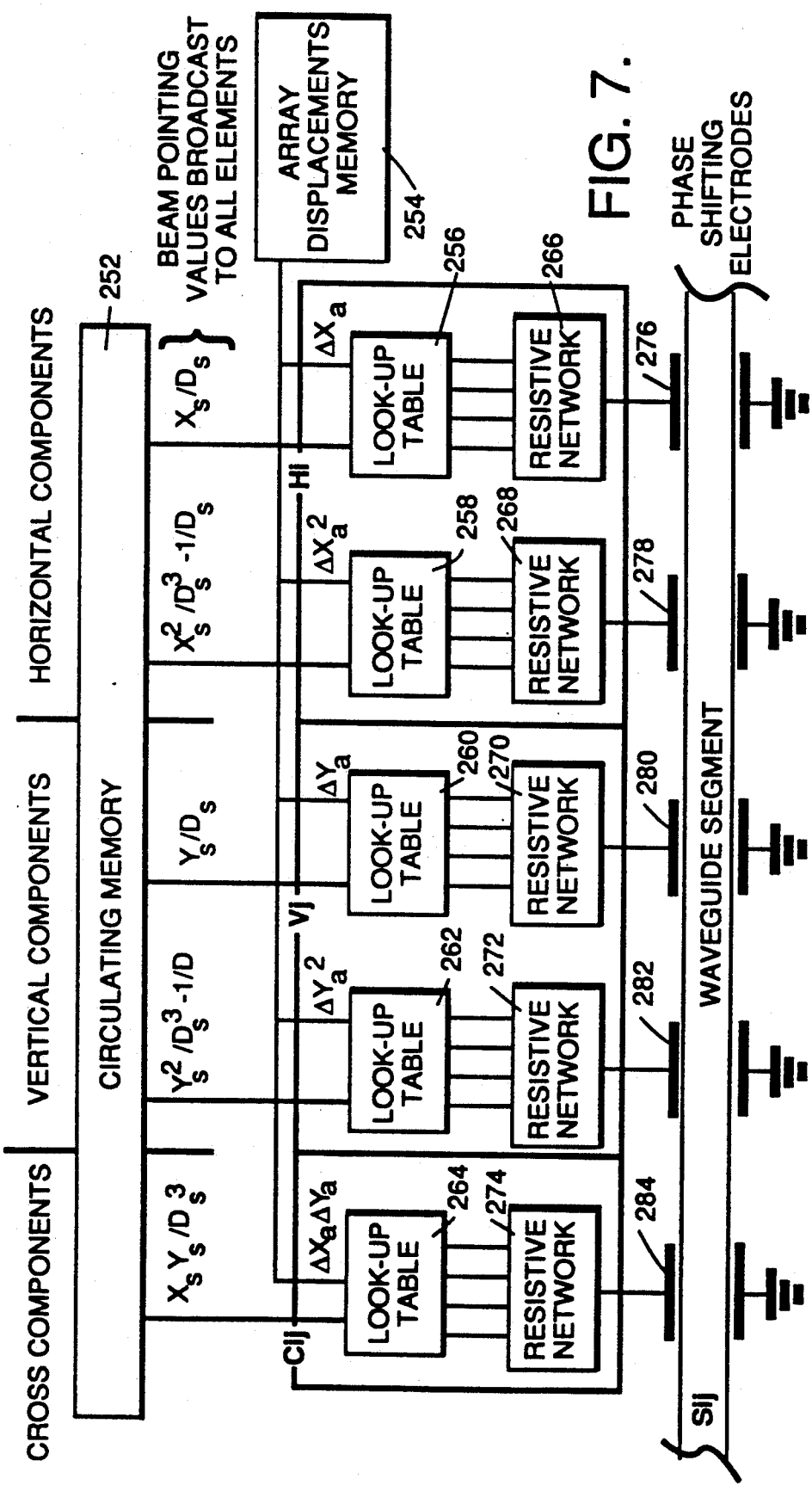

FIG. 7 illustrates in a more detail the components of the electronics, i.e., a controller, for calculating phase shifts, for providing the phase shift drives for an exemplary light source in the array. This controller may serve, e.g., as the controller 50 of the array of FIG. 1. A circulating memory 252 stores horizontal, vertical and total displacement values from the center of the array for successive screen locations. Various ratios are calculated according to the second order Taylor expansion of the phase shift, in terms of screen coordinates $x_s$, $y_s$ and array element displacements $\Delta x_a$ $\Delta y_a$. These terms are segregated into horizontal, vertical and cross effect phase corrections.

A memory 254 stores the array element displacements locally to provide values of $\Delta x_a$, $\Delta x_a^2$, $\Delta y_a$, $\Delta y_a^2$ and $\Delta x_a \Delta y_a$. These values comprise input addresses, together with the terms stored in the circulatory memory, for 4-bit look-up memory tables 256-264.

The lookup tables 256-264 are configured to give products such as $(x_s \Delta x_a / D_s)$ etc., which appear in the Taylor series expansion. Note there are five such tables in this embodiment, each of which is assigned to a unique term of the first and second order corrections. Taken together these tables exhaust all terms out to second order.

The outputs from the look-up tables in turn drive respective precision trimmed resistive networks 266-274. The precision trimmed resistive networks are configured to translate the values from the lookup tables into discrete voltage levels. These voltages are applied in series to the phase shifting electrodes 278, 280, 282, 284 for a particular light wave guide, $S_{ij}$. As light propagates the individual phase corrections are added to give the proper second order phase correction.

One application for the optical phased array is in optical memories. Optical phased arrays that are capable of focussing a small spot of light on a screen and sweeping it to produce a pattern or image can be used as optical memory readouts.

Figure 8:
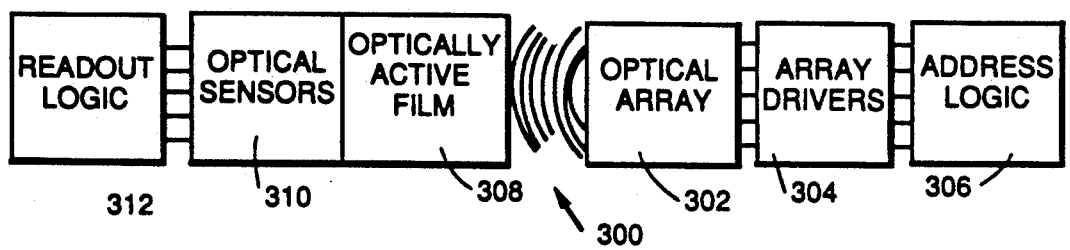
FIG. 8 is a schematic block diagram of an optical memory incorporating an optical phased array in accordance with the invention.

One exemplary embodiment of a memory 300 employing an optical phased array readout in accordance with the invention is shown in the schematic block diagram of FIG. 8. Here, an optical phased array 302 in accordance with the invention is controlled by the array drivers 304 and the address logic 306 to direct the array beam to a desired location at which the data to be read out is stored. The array drivers translate an address for the focus into drive voltages for the phase shifters. An optically active film 308 serves as the active memory element to store the data, and, in an exemplary binary-valued data system, either is light transmissive or light absorptive, so that when the array beam is focussed at a particular memory location, depending on the memory location state, light will either be transmitted to the optical sensors 310 or blocked from passing to the sensors 310. The optical sensors, which can be fabricated by conventional electronic technology (i.e., integrated photo-voltaics), sense the level of the light passing through the memory film. This light level reflects the information stored in the memory, so the output of the sensors can be read as digital information from the memory. The readout logic 312 coupled to the sensors 310 reads the state of the sensors to determine the data value to be read out of the memory system.

In memory applications, a two-dimensional optical phased array is superior in speed and three-dimensional focussing capabilities over other laser readout schemes. This makes a memory based on a phased array readout faster and of higher capacity than competing technologies. Optical phased arrays make true three-dimensional optical memories possible because of the reduction of stray light outside the focus. Three-dimensional memories afford several orders of magnitude improvement in storage capacity.

Figure 9:
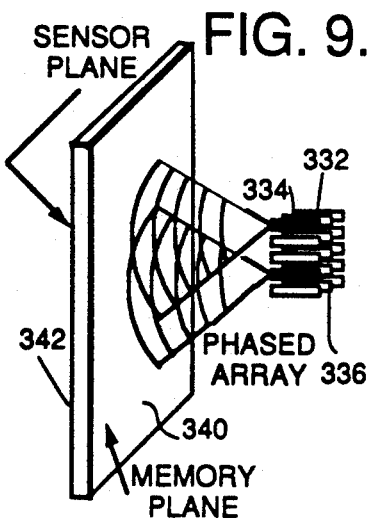
FIG. 9 is a schematic block diagram of one embodiment of an optical phased array active memory element and sensor array for the optical memory of FIG. 8.

FIG. 9 illustrates one embodiment of the optical array, memory film and sensor comprising an optical memory in accordance with the invention. Here, the optical array is two-dimensional, comprising array elements arranged in a two dimensional layout. For clarity, only two phased array elements are shown as active in FIG. 8. Beams from all array elements interfere constructively at the target memory element 338 comprising the memory film 310, and interfere destructively at all other memory locations. The optical film 340 can comprise, for example, a film of bacteriorhodopsin or a similar optically nonlinear material. The data is read by optical sensors at sensor plane 34. The address logic, array drivers and readout logic are not shown in FIG. 8.

Bacteriorhodopsin exists in two metastable forms at temperatures below 100° K., the bR form (with an absorption maximum at 570 nanometers) and the K form (with an absorption maximum at 610 nanometers). Light at 570 nm switches a significant portion of the bR from to the K form with a quantum efficiency of 0.3 or more. Light at 610 nm switches the K form to bR with a quantum efficiency of 0.7 or more. Switching times both ways are on the order of a few picoseconds. If operation at low temperatures is unacceptable, bacteriorhodopsin can be switched between the M state (absorption maximum at 412 nm) and the bR state at room temperature with a somewhat lower response. See, "Optical Random Access Memory Based on Bacteriorhodopsin," R. Birge et al., *Molecular Electronics, Biosensors and Biocomputers*, ed. F. T. Hong, pp. 369-380, Plenum Press, NY, 1989. At low temperatures, two sets of readout array are required for bR, one operating in the red and the other operating in the green. The memory readout scheme is "read then write." According to this scheme, a memory location is read in one color. The photosensor records the light absorbed. When the read part of the cycle is completed, the phased arrays are activated to restore the memory to the original state. This is the write part of the cycle.

Figure 10:
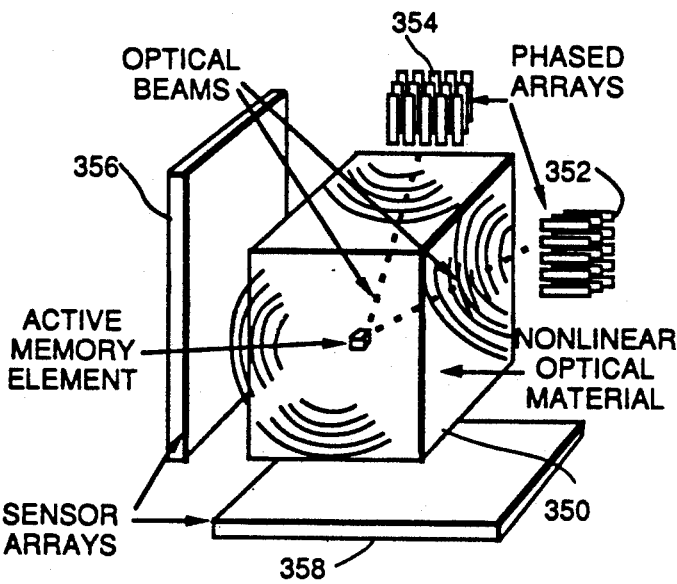
FIG. 10 illustrates elements of a three-dimensional optical memory in accordance with the invention.

FIG. 10 illustrates the arrangement for a three dimensional optical memory in accordance with the block diagram of FIG. 8. Here an active memory element 350 in the form of a cube of optically nonlinear material, such as bacteriorhodopsin, stores the data and is addressed by two optical arrays 352 and 354 in accordance with the invention. The nonlinear material is characterized by a high two-photon absorption cross section, so that the material responds only at the intersection of the beams from the arrays 352 and 354. Sensor arrays 356 and 358 are disposed adjacent sides of the memory element 350 to read out the addressed data.

Another application for optical phased arrays embodying the invention is that of imaging systems wherein the array beam is selectively scanned over a screen, for example, to produce a desired image. Thus, one can produce optical images in accordance with the invention directly without the use of cathode ray tubes, thereby making possible television sets without vacuum tubes. Depending on the array size, image brightness of the same order as sunlight (1 k Watt/m$^2$) can be obtained. Using a 1000×1000 array (with a 1 cm$^2$ size semiconductor or fiberoptic bundle), images with the resolution of the human eye (one milliradian) can be produced.

Figure 11:
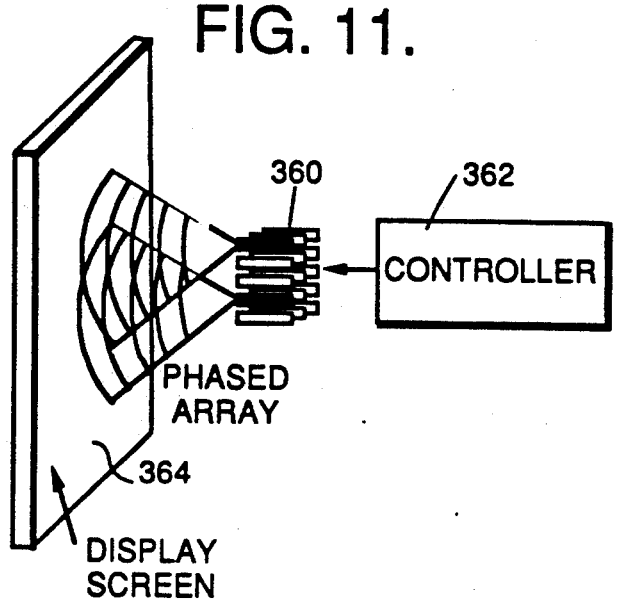
FIG. 11 is a simplified schematic diagram of an image display incorporating an optical phased array in accordance with the invention.

FIG. 11 shows a simplified diagram of an imaging system including an optical phased array in accordance with the invention. The phased array 360 is controlled by the system controller 362 to scan its beam across the screen 364 and to focus the beam into a spot, thereby producing a desired image. If the phased array includes a linear array of light emitters, i.e., a one-dimensional array, say along the x-axis, then mechanical scanning of the linear array in the y-axis direction maybe used in conjunction with the electro-optical scanning in the x direction to generate a two-dimensional image.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. An optical phased array, comprising:
   an input light source;
   a substrate having an optical waveguide pattern formed thereon, said pattern comprising an input waveguide having a light receiving end disposed to receive light from said light source and a plurality of optical waveguide channels terminating in respective light emitting ends, said waveguide pattern arranged to divide the light received in said input waveguide into said plurality of optical channels, wherein said light emitting ends comprise an array of monochromatic light emitters arranged along an axis; and
   means for adjusting the relative optical phase delay between adjacent light emitters to provide a progressive phase delay change across said array to steer a focussed spot of light resulting from said light emitters to a desired direction.

2. The phased array of claim 1 wherein the number n of said emitters comprising said array is at least one thousand.

3. The phased array of claim 1 wherein said array comprises a plurality of optical fibers, a light source for illuminating a first end of said fibers, and wherein light is emitted from a second end of said fibers to comprise said light emitters.

4. The phased array of claim 1 wherein said light source comprises a laser oscillator.

5. The phased array of claim 1 wherein said optical waveguide patter comprises a plurality of Y waveguide junctions for dividing the light from one segment of waveguide into two succeeding waveguide segments.

6. The phased array of claim 1 wherein the respective locations of said emitters within a corresponding array cell location is randomized to reduce the sidelobes of said focussed spot of light.

7. An optical phased array, comprising
   an input light source;
   a substrate having an optical waveguide pattern formed thereon, said pattern comprising an input waveguide having a light receiving end disposed to receive light from said light source and a plurality of optical waveguide channels terminating in respective light emitting ends, said waveguide pattern arranged to divide the light received in said input waveguide into said plurality of optical channels, wherein said light emitting ends comprise an array of monochromatic light emitters arranged along an axis; and
   means for adjusting the relative optical phase delay between adjacent light emitters to provide a progressive phase delay change across said array to steer a focussed spot of light resulting from said light emitters to a desired direction, wherein light is focussed at focal point FP by said array of monochromatic light emitters when the following condition is satisfied for all pairs (x,y) of said light emitters:

$$\phi_x + (2\pi d_{x,FP})\lambda = +(2\pi d_{y,FP})/\lambda + 2\pi K$$

where $\phi_x$ is the phase adjustment at light emitter x, $d_{x,FP}$ is the distance from light emitter x to the focal point, d is the wavelength of light, $\phi_y$ is the phase adjustment at light emitter y, $d_{y,FP}$ is the distance from light emitter y to the focal point, and k is an integer.

8. An optical phased array, comprising:
   an input light source;
   a substrate having an optical waveguide pattern formed thereon, said pattern comprising an input waveguide having a light receiving end disposed to receive light from said light source and a plurality of optical waveguide channels terminating in respective light emitting ends, said waveguide pattern arranged to divide the light received in said input waveguide into said plurality of optical channels;
   a plurality of optical fibers, a first end of each fiber being optically coupled to receive light from said light emitting ends, and wherein second ends of said fibers are arranged along an axis to comprise an array of monochromatic light emitters; and
   means for adjusting the relative optical phase delay between adjacent light emitters to provide a progressive phase delay change across said array to steer a focussed spot of light resulting from said light emitters to a desired direction, wherein said adjusting means comprises a plurality of optical waveguides, one for each fiber, a pair of electrodes straddling each said optical waveguide and a means for developing a potential difference across said electrodes, and wherein said optical waveguides comprise a light conducting material characterized by a relatively high electro-optic coefficient, wherein said optical phase delay may be varied by adjusting said potential difference, thereby changing the index of refraction of said optical waveguide material.

9. The phased array of claim 8 wherein said fiber material comprises lithium niobate.

10. An optical phased array, comprising:
an input light source;
a substrate having an optical waveguide pattern formed thereon, said pattern comprising an input waveguide having a light receiving end disposed to receive light from said light source and a plurality of optical waveguide channels terminating in respective light emitting ends, said waveguide pattern arranged to divide the light received in said input waveguide into said plurality of optical channels;
a plurality of optical fibers, a first end of each fiber being optically coupled to receive light from said light emitting ends, and wherein second ends of said fibers are arranged along an axis to comprise an array of monochromatic light emitters; and
means for adjusting the relative optical phase delay between adjacent light emitters to provide a progressive phase delay change across said array to steer a focussed spot of light resulting from said light emitters to a desired direction, wherein said adjusting means comprises a plurality of optical waveguides, one for each said optical fiber, and wherein each said optical waveguide comprises a light conducting material characterized by a substantial piezoelectric characteristic, whereby the optical length of said material varies in dependence on the potential difference applied across said material, and said adjusting means further comprises means for applying a selectable potential difference across said electrodes, thereby varying the optical length of said optical waveguide in dependence on the magnitude of said applied potential difference.

11. An optical phased array, comprising:
an input light source;
a substrate having an optical waveguide pattern formed thereon, said pattern comprising an input waveguide having a light receiving end disposed to receive light from said light source and a plurality of optical waveguide channels terminating in respective light emitting ends, said optical waveguide channels comprising a light conducting material characterized by a relatively large electro-optic coefficient, said waveguide pattern arranged to divide the light received in said input waveguide into said plurality of optical channels, wherein said light emitting end comprise an array of monochromatic light emitters arranged along an axis; and
means for adjusting the relative optical phase delay between adjacent light emitters to provide a progressive phase delay change across said array to steer a focussed spot of light resulting from said light emitters to a desired direction, wherein said adjusting means comprises for each channel a pair of metal electrodes straddling the optical waveguide comprising said channel and a means for developing a selectable potential difference across said electrode pair, whereby said optical phase delay may be varied by adjusting said potential difference, thereby changing the index of refraction of said light conducting material.

12. The phased array of claim 11 wherein said light conducting material comprises lithium niobate.

13. An optical phased array, comprising:
a laser oscillator light source;
a substrate having an optical waveguide pattern formed thereon, said pattern comprising an input waveguide having a light receiving end disposed to receive light from said light source and a plurality of optical waveguide channels terminating in respective light emitting ends, said waveguide pattern arranged to divide the light received in said input waveguide into said plurality of optical channels, wherein said light emitting ends comprise an array of monochromatic light emitters arranged along an axis; and
means for adjusting the relative optical phase delay between adjacent light emitters to provide a progressive phase delay change across said array to steer a focussed spot of light resulting from said light emitters to a desired direction, said adjusting means comprising an optical waveguide comprising a light conductor for conducting the light from said light source, said light conductor characterized by a relatively large electro-optic coefficient, a pair of electrodes straddling said optical waveguide, and a means for developing a selectable potential difference across said electrode pair, whereby the optical phase delay through said optical waveguide may be varied by adjusting said potential difference, thereby changing the index of refraction of said light conducting material.

14. The phased array of claim 13 wherein said light emitters each further comprise a laser amplifier for amplifying the light from said optical waveguide.

15. A two-dimensional optical phased array, comprising:
a two-dimensional array of monochromatic light emitters, each said emitter disposed within an emitter cell forming a regular subdivision of the array area, and wherein the displacement of said emitters within the respective cells resembles a random distribution; and
means for adjusting the relative optical phase delay between adjacent light emitters to steer a focussed spot of light resulting from said light emitters to a desired direction, wherein the distribution of said emitters provides efficient cancellation of sidelobe energy.

16. The optical phased array of claim 15 wherein the number n of said emitters comprising said array is at least one thousand.

17. The optical phased array of claim 15 wherein said array comprises an input light source, an optical waveguide pattern formed on a common substrate, said waveguide pattern arranged to divide the light from said light source into a plurality of optical channels which each allow the light to be emitted from a light emitting channel end, and a plurality of optical fibers, one for each optical channel and each having a first end optically coupled to receive the light emitted from said respective channel end, each fiber further having a second end forming one of said emitters.

18. The optical phased array of claim 17 wherein said fibers are arranged in a bundle, and said fibers have been cut to form said second ends, said second ends being polished to provide a plane face.

19. A two-dimensional optical phased array, comprising:

a two-dimensional array of monochromatic light emitters arranged in horizontal rows and vertical columns, each said emitter disposed within an emitter cell forming a regular subdivision of the array area, and wherein the displacement of said emitters within the respective cells resembles a random distribution; and means for adjusting the relative optical phase delay between adjacent light emitters to steer a focussed spot of light resulting from said light emitters to a desired direction, wherein the distribution of said emitters provides efficient cancellation of sidelobe energy, said means for adjusting comprising means for providing a horizontal phase shift factor to each of said light emitters, said horizontal factor being a constant for each of the emitters in a given row, means for providing a vertical phase shift factor to each of said light emitters, said vertical factor being a constant for each of the emitters in a given column, and means for providing a cross effects factor to each of said emitters indicative of the cross effect between the horizontal and vertical elements.

20. The optical phased array of claim 19 wherein each said waveguide channel comprises a light conductive material characterized by a relatively large electro-optic coefficient, said adjusting means further comprises for each waveguide channel first, second and third electrode pairs straddling said optical waveguide channel, said horizontal, vertical and cross effects factors comprising voltage values applied across said respective first, second and third electrode pairs, whereby the optical phase delay through said optical waveguide may be varied by adjusting said respective voltages across said electrode pairs, thereby changing the index of refraction of said light conducting material.

* * * * *

UNITED STATES PATENT AND TRADEMARK OFFICE
CERTIFICATE OF CORRECTION

PATENT NO. : 5,233,673

DATED : August 3, 1993

INVENTOR(S) : VICTOR VALI, DAVID B. CHANG, ALBERT F. LAWRENCE and GARY N. LANDIS It is certified that error appears in the above-identified patent and that said Letters Patent is hereby corrected as shown below:

Title page, item. [75] Inventors:, between "San Diego," and "all of Calif.", please add --Gary N. Landis, Los Angeles--.

Signed and Sealed this

Nineteenth Day of October, 1993

*Attest:*

BRUCE LEHMAN

*Attesting Officer*  *Commissioner of Patents and Trademarks*